(12) United States Patent
Nishihara et al.

(10) Patent No.: US 6,217,714 B1
(45) Date of Patent: *Apr. 17, 2001

(54) SPUTTERING APPARATUS

(75) Inventors: Munekazu Nishihara, Neyagawa; Teiichi Kimura, Itami; Isamu Aokura, Osaka, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/672,660

(22) Filed: Jun. 28, 1996

(30) Foreign Application Priority Data

Jun. 29, 1995 (JP) .................................... 7-163166

(51) Int. Cl.⁷ .................................... C23C 14/34
(52) U.S. Cl. .................... 204/192.12; 204/298.03; 204/298.08; 204/298.19; 204/298.26
(58) Field of Search ............... 204/192.12, 298.03, 204/298.08, 298.19, 298.26, 192.13

(56) References Cited

U.S. PATENT DOCUMENTS

| | | | |
|---|---|---|---|
| 4,162,954 | * 7/1979 | Morrison, Jr. | 204/298.19 |
| 4,810,346 | * 3/1989 | Wolf et al. | 204/298.19 X |
| 4,894,133 | * 1/1990 | Hedgcoth | 204/298.26 X |
| 4,902,394 | * 2/1990 | Kenmotsn et al. | 204/298.08 X |
| 4,981,566 | * 1/1991 | Wurczinger | 204/298.26 X |
| 5,053,252 | * 10/1991 | Kimura et al. | 204/298.26 X |
| 5,340,454 | * 8/1994 | Schaefer et al. | 204/298.26 X |
| 5,433,835 | 7/1995 | Demaray et al. | |
| 5,441,615 | * 8/1995 | Mjakai et al. | 204/298.26 |
| 5,478,455 | * 12/1995 | Actor et al. | 204/298.26 |
| 5,487,822 | 1/1996 | Demaray et al. | |
| 5,556,525 | * 9/1996 | Krivokapic et al. | 204/298.08 X |
| 5,824,426 | * 10/1998 | Iketani et al. | 428/694 |

FOREIGN PATENT DOCUMENTS

| | | | |
|---|---|---|---|
| 57-23227 | 2/1982 | (JP) . | |
| 0143067 | * 8/1984 | (JP) | 204/298.26 |
| 63-28985 | 6/1988 | (JP) . | |
| 61-61387 | 11/1988 | (JP) . | |
| 63-65754 | 12/1988 | (JP) . | |
| 1-240656 | 9/1989 | (JP) . | |
| 402243762 | * 1/1990 | (JP) | 204/298.26 |
| 404006271 | * 1/1992 | (JP) | 204/298.26 |
| 6-192833 | 7/1994 | (JP) . | |
| 7-197254 | 8/1995 | (JP) . | |

* cited by examiner

Primary Examiner—Carol Chaney
Assistant Examiner—Julian A. Mercado
(74) Attorney, Agent, or Firm—Wenderoth, Lind & Ponack, L.L.P.

(57) ABSTRACT

In a sputtering apparatus, in a vacuum chamber having a gas supply and a gas discharge functions, a substrate is set to a supporting part therefor and a target is disposed at an electrode connected with a power source within a plane opposite to the substrate, so as to form a film while holding the substrate in a fixed state to the target. The electrode is divided into three or more electrode parts, the target is divided and disposed on the three or more electrode parts within the plane, and a magnet is arranged for each divided target at a position where a line of magnetic force on a surface of the each target is generated by each magnet.

12 Claims, 18 Drawing Sheets

21 : FILM THICKNESS ON SUBSTRATE

22 : FILM THICKNESS OBTAINED FROM EACH TARGET

31: FILM THICKNESS ON SUBSTRATE

32: FILM THICKNESS OBTAINED FROM EACH TARGET

41: FILM THICKNESS ON SUBSTRATE

42: FILM THICKNESS OBTAINED FROM EACH TARGET

51 : FILM THICKNESS ON SUBSTRATE

52 : FILM THICKNESS OBTAINED FROM EACH TARGET

SPUTTERING APPARATUS

BACKGROUND OF THE INVENTION

The present invention relates to a sputtering apparatus and more particularly, to a sputtering apparatus adapted to form thin films on angular substrates of a large area uniformly at high speeds.

A sputtering apparatus has been often used to manufacture semiconductor devices, optical discs, liquid crystal, or electronic components, etc., because of its capability to form a thin film of a target material stably on a substrate. As performance capabilities required for this kind of sputtering apparatus, speed and cost are important, that is, how quickly and stably the apparatus forms a uniform film all over the substrate at low costs.

Meanwhile, a stationary formation method has been increasingly employed in recent sputtering apparatuses, besides a substrate-moving method whereby a film is formed on a target while the substrate is moved to the target. The substrate is laid still and opposed to the target in the stationary method. The stationary method advantageously improves a film-forming speed, decreases dusts, and reduces an equipment cost.

During sputtering, atoms sputtered from on the target are radiated with a certain angle distribution. Therefore, it is necessary in the stationary method to optimize a shape of the target, structures, and sizes of magnets, etc. so as to fulfill the aforementioned performance capabilities in accordance with a shape and a size of the substrate to which a thin film is formed.

Since circular substrates represented by silicon wafers have been used for manufacturing semiconductor devices and optical discs, the sputtering apparatus of the stationary model has employed a disc-like target. A ring-shaped eroded part (referred to as an "erosion" below) is formed on the circular target to secure a uniform thickness of the thin film formed on the substrate, which ensures a thickness uniformity all over the surface of the circular substrate.

The above-referred erosion is generated when the plasma is locally distributed in consequence of the drift motion of electrons on the target surface. Therefore, a fixed magnet having a ring-shaped distribution of magnetic field is arranged below the target to realize the erosion in the form of a ring. Since the electrons are trapped while drifting within the ring in this case, the plasma is generated with a high density, so that many electrons are sputtered and a film is formed at high speeds.

In the meantime, when a film is to be formed on an angular substrate of a display device or the like, a fixed magnet to generate a linear erosion on an angular target is disposed below the target thereby to assure a film thickness distribution on the angular substrate.

However, the obtained linear erosion is not sufficient to confine the plasma through the drift of electrons, eventually making it hard to form the film at high speeds. As such, the magnet is generally constructed in such configuration that two linear erosion parts parallel to each other are connected at both ends thereof by semi-circular erosion parts. The electrons can thus be trapped in the same fashion as when the ring-shaped target is used, and a high-density plasma is generated thereby to form the film quickly.

In the case of forming a film on an angular substrate of a larger area in comparison with that of the above target, while the angular substrate with a large area is held by a substrate holder which is movable facing to the target, the substrate holder is moved thereby to form the film continuously. Thus, the film can be formed on the angular substrate of a larger area in comparison with that of the target. When the substrate holder is moved in parallel to the surface of the target, it is called as a tray system. On the other hand, when the substrate holder is rotated with a radius in a vertical direction of the target surface, this is called as a carousel system.

When the film formation is carried out by moving the substrate as above, the film is formed to the substrate holder as well, resulting in disadvantages of an increase of dusts as the film of the substrate holder is separated or an increase of mechanism elements in a vacuum which leads to an increase of the equipment cost, etc.

Under such being the circumstances, similar to the circular substrate, the angular substrate of a large area has been started to be treated in the stationary state.

A conventional method of forming a thin film on the angular substrate of a large area in the stationary state will be described with reference to the drawings.

FIG. 7 is a perspective sectional view showing the basic structure of a conventional apparatus forming a film to a large-area, angular substrate in the stationary method with the use of sputtering.

In FIG. 7, a reference numeral 12 is a magnet which is movable on a rear surface of a target 11 in parallel to the surface of the target 11. Other reference numerals are respectively: 13 a large-area glass substrate; 14 a DC power source for impressing power to the target 11; 15 a line of magnetic force generated on the target 11 by the magnet 12; and 16 atoms of a target material sputtered from on the target 11.

How the film-forming apparatus constituted as above operates to sputter in the stationary method will now be depicted.

Sputtering is a way of forming a thin film having a composition of a target 11 on a substrate 13. Concretely, while an inert gas such as argon gas or the like is introduced in a vacuum chamber (not shown), the electric power is supplied from the power source 14 to an electrode part (cathode) including the target 11. The introduced gas is turned into a plasma state, sputtering the material of the target 11 by means of gas ions, thereby forming a thin film on the substrate 13.

In the apparatus of FIG. 7, in addition to the above-discussed principle of sputtering, the magnet (permanent magnet) 12 is disposed at a rear surface of the target 11 to generate lines of magnetic force as indicated by the dotted lines 15 on a front surface of the target 11, and the electrons (not shown) as a cause to generate plasma are thus confined in an area surrounded by the lines 15. As a result of this, the plasma is locally generated centering a part where components of each line 15 of magnetic force parallel to the target 11 are zero, and the target 11 is consequently sputtered by a lot of gas ions. Thus, since an amount of sputtered atoms 16 is increased, a film-forming speed is improved. As a result, an erosion as a local eroded part is formed on the sputtered target 11.

FIG. 8 is a simulation result of a thickness distribution of the film formed on the substrate 13 when the magnet 12 is set still at the rear surface of the target 11 on a center point of the substrate 13.

A position within a plane of the substrate 13 is indicated by its distance from the center point of the substrate 13 in X- and Y-axes directions in FIG. 8. A relative thickness of the film at the position is shown on a Z-axis.

As is understood from FIG. 8, the thickness distribution in the Y-axis direction can be uniformed by optimizing a distribution of magnetic field generated by the magnet 12. However, the thickness in the X-axis direction is rapidly decreased as the position of the film is far from a central part (X=0) of the magnet 12.

As a way to obtain a uniform thickness distribution all over the surface of the substrate 13, the magnet 12 may be enlarged in size thereby to increase a uniform thickness area in the X-axis direction. However, a limit of a holding force of the magnet 12 weakens the line 15 of magnetic force generated on the surface of the target 11 if a distance between the N and S poles of the magnet 12 is increased. An effect of the magnet to confine the plasma tends to be null.

In the prior art, therefore, the magnet 12 is let to slide in the X-axis direction facing to the substrate 13 at the formation of the film, with the result that the film is obtained with a thickness distribution of an integration in time in the X-axis direction of the thickness distribution when the magnet 12 is still. The thickness distribution of the film all over the surface of the substrate 13 is made uniform in this manner.

In the above-described conventional method, although the thickness distribution in the Y-axis direction on the substrate 13 is stable because it is determined by characteristics of the magnet 12, that in the X-axis direction is greatly changed depending on the control of a speed distribution when the magnet 12 is slid, thereby making it difficult to form the film stably.

If it is so arranged as to form the film on the substrate 13 only when the magnet 12 is slid at a constant speed, the film is actually formed relatively stably. However, this arrangement necessitates a space of a width of the magnet 12 in the X-axis direction to allow the magnet 12 to move, at both ends on the substrate 13. In other words, the apparatus including the target 11 and the vacuum chamber, etc. becomes bulky in size.

As compared with the film-forming speed when the magnet 12 is kept still, the speed is decreased when the magnet 12 is slid, and therefore more electric power becomes required to improve the film-forming speed, that is, the power source 14 should be designed to produce considerably large power.

In the case where the target 11 is metallic, plasma can be obtained by discharging with the use of the DC power source 14. However, if the target is made of an insulating material such as an oxide or the like, the discharge is not performed by the DC power source 14 and therefore, an RF power source or the like high frequency power source is generally employed in place of the DC power source 14. In such case, a matcher for matching an impedance is set between the power source 14 and the target 11 to realize discharging of electricity. However, since a surface state of the target 11 is changed or a change is caused in shape of the erosion subsequent to the slide of the magnet 12 during discharging, the matching state is not stable and the film-forming speed is varied.

Further, in order to form the film at a uniform speed, the target 11 should be an integral body of an area about three times the area of the substrate 13. Therefore, the vacuum chamber becomes large in size, the material cost is raised and the maintenance work to exchange the exhausted target 11 needs an extensive process.

SUMMARY OF THE INVENTION

The object of the present invention is therefore to provide a sputtering apparatus of a stationary type which can form thin films at high speeds with good uniformity on angular substrates of a large area and which can form thin films of various kinds of material including insulating substances stably at low costs.

In accomplishing these and other objects, according to one aspect of the present invention, there is provided a sputtering apparatus in which in a vacuum chamber having a gas supply and a gas discharge functions, a substrate is set to a supporting part therefor and a target is disposed at an electrode connected with a power source within a plane opposite to the substrate, so as to form a film while holding the substrate in a fixed state to the target, wherein the electrode is divided into three or more electrode parts, the target is divided and disposed on the three or more electrode parts within the plane, and a magnet is arranged for each divided target at a position where a line of magnetic force on a surface of the each target is generated by each magnet.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
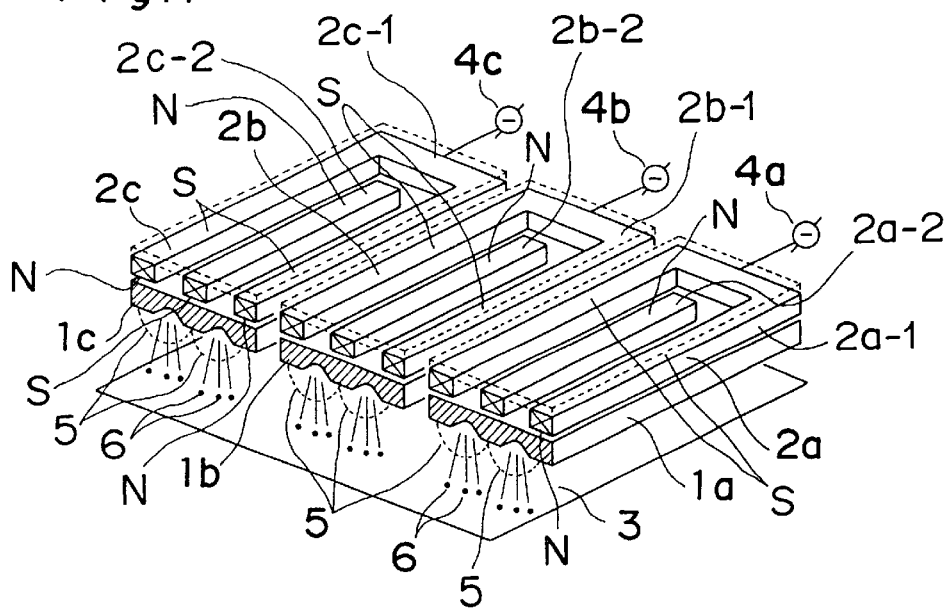
FIG. 1 is a perspective sectional view of a sputtering apparatus in the basic constitution according to a first embodiment of the present invention.

Before the description of the present invention proceeds, it is to be noted that like parts are designated by like reference numerals throughout the accompanying drawings.

A first embodiment of the present invention will be described below.

Figure 2:
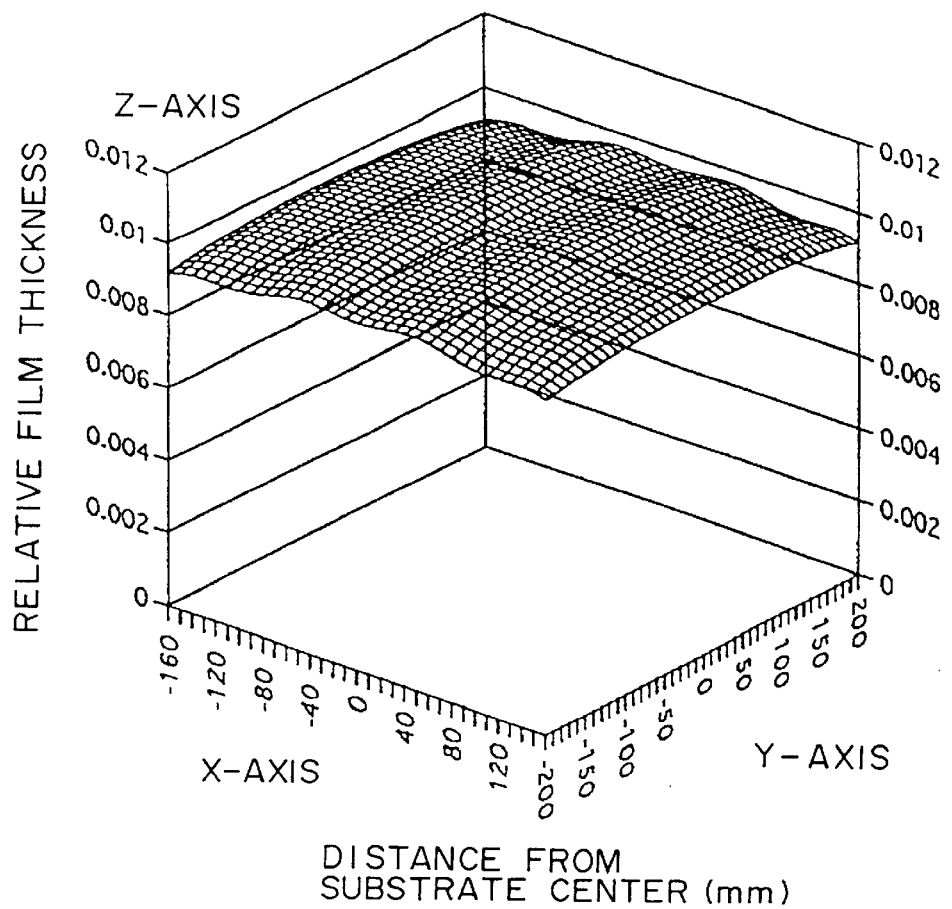
FIG. 2 is a diagram of a simulation result of a thickness distribution of a film formed on a substrate by the sputtering apparatus of the first embodiment.

FIG. 1 is a perspective sectional view showing the basic structure of a film-forming apparatus using sputtering to a large-area substrate, for example, 300 mm×400 mm or more rectangular substrate in a stationary method according to the first embodiment. FIG. 2 shows a simulation result of a thickness distribution of a film formed on the substrate by the film-forming apparatus of FIG. 1.

In FIG. 1, references 1a, 1b, and 1c are rectangular targets obtained by splitting a target into three, and 2a, 2b, and 2c are fixed magnets set at rear surfaces of the corresponding targets 1a, 1b, and 1c. 3 is a rectangular substrate of a large area. Variable power sources 4a, 4b, and 4c impress electric powers to electrode parts 401a, 401b, 401c (See FIG. 9) including the targets 1a, 1b, and 1c. A dotted line 5 represents lines of magnetic force generated on the targets 1a, 1b, 1c by the magnets 2a, 2b, 2c, respectively. 6 is atoms of a target material sputtered from on each target 1a, 1b, 1c. Each of the magnets 2a, 2b, 2c is constituted of a linear magnet element 2a-2, 2b-2, 2c-2 and a rectangular frame-shaped magnet element 2a-1, 2b-1, 2c-1 surrounding the linear magnet element 2a-2, 2b-2, 2c-2.

The sputtering apparatus in the above constitution operates as follows.

In FIG. 1, argon gas is introduced into a vacuum chamber (not shown). A reaction gas is mixed with the argon gas in execution of reactive sputtering. While a vacuumizing efficiency and a gas flow rate are controlled to keep a gas pressure constant, electric powers are supplied from the power sources 4a, 4b, and 4c to electrode parts 401a, 401b, 401c including targets 1a, 1b, and 1c, whereby molecules of the introduced gas are turned into a plasma state.

Figure 3:
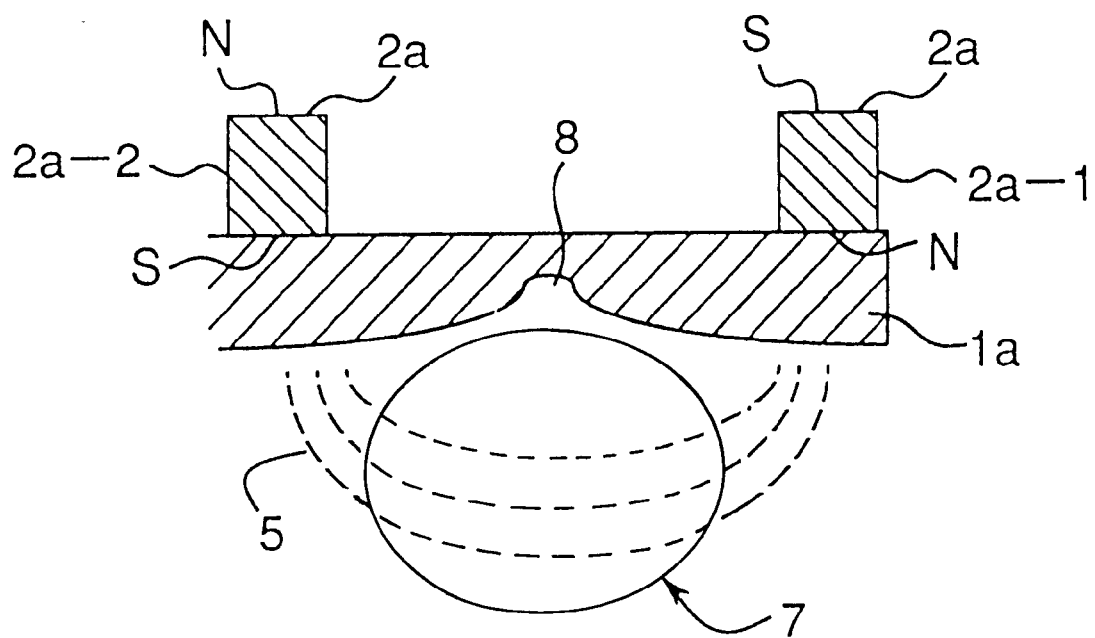
FIG. 3 is a detailed sectional view showing an operating state on a target in the first embodiment.

FIG. 3 is a detailed sectional view on the target 1a of FIG. 1. The plasma 7 generated at this time is locally distributed at an area surrounded by the lines 5 of magnetic force over the target 1a as a result of trapping of electrons by the lines 5 of magnetic force. The same local distribution of the plasma is detected on each of the targets 1b and 1c alike.

Since the surface of each target 1a, 1b, 1c shows a minus potential because of the power sources 4a, 4b, 4c, argon ions with positive charges in the plasma go straight to collide the targets 1a, 1b, 1c with large energies, thereby sputtering atoms 6 of the target material. Since the target atoms 6 are more sputtered where a plasma density is locally high with many argon ions, consequently, the target material is locally eroded to form an erosion 8 on each of the target 1a, 1b, 1c as shown in FIG. 3. The sputtered atoms 6 from the erosion 8 adhere to the flat substrate 3 set opposite to a plane including the target 1a, 1b, 1c, whereby a thin film is formed thereon.

According to the first embodiment, since the magnet 2a, 2b, 2c is in the same shape as the target 1a, 1b, 1c i.e., rectangle, each of parts surrounded by the lines 5 of magnetic force and the target 1a, 1b, 1c (referred to as a "magnetic tunnel" hereinafter) generates two linear magnetic tunnels in a longitudinal direction (in a Y direction) which is a longer side of the target and magnetic tunnels each of which is of a U-shape as a combination of circular arcs and a line at both ends of the linear magnetic tunnels in a lateral direction (in an X direction) which is a shorter side of the target on each of the target 1a, 1b, 1c.

Figure 4:
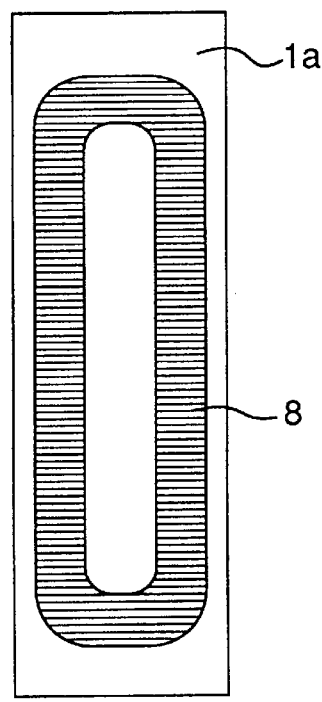
FIG. 4 is a diagrammatic plan view of an erosion area formed on a surface of the target in the first embodiment.

Because of the arrangement of the magnets 2a–2c as in FIG. 1, the lines of magnetic force are connected at both ends thereof, thereby forming an annular closed magnetic tunnel. To the electrons trapped by the distribution of the lines of magnetic force acts a Lorentz force resulting from the mutual action between the magnetic field and an electric field from the target 1a, 1b, 1c, so that the electrons are drifted along the annular closed magnetic tunnel. Without a terminal end present in the annular closed magnetic tunnel, the trapped electrodes continue to drift for a long time, further generating plasma. In consequence, a high-density plasma is obtained along the annular closed magnetic tunnel. FIG. 4 is a plan view of the erosion area 8 formed on the surface of the target 1a of FIG. 1.

As is clearly shown in FIG. 4, the high-density plasma produces the annular closed erosion 8 by a combination of the linear and U-shaped magnetic tunnels on each target 1a, 1b, 1c. Therefore, many atoms 6 are sputtered simultaneously, realizing a high-speed film formation on the substrate 3.

Figure 5:
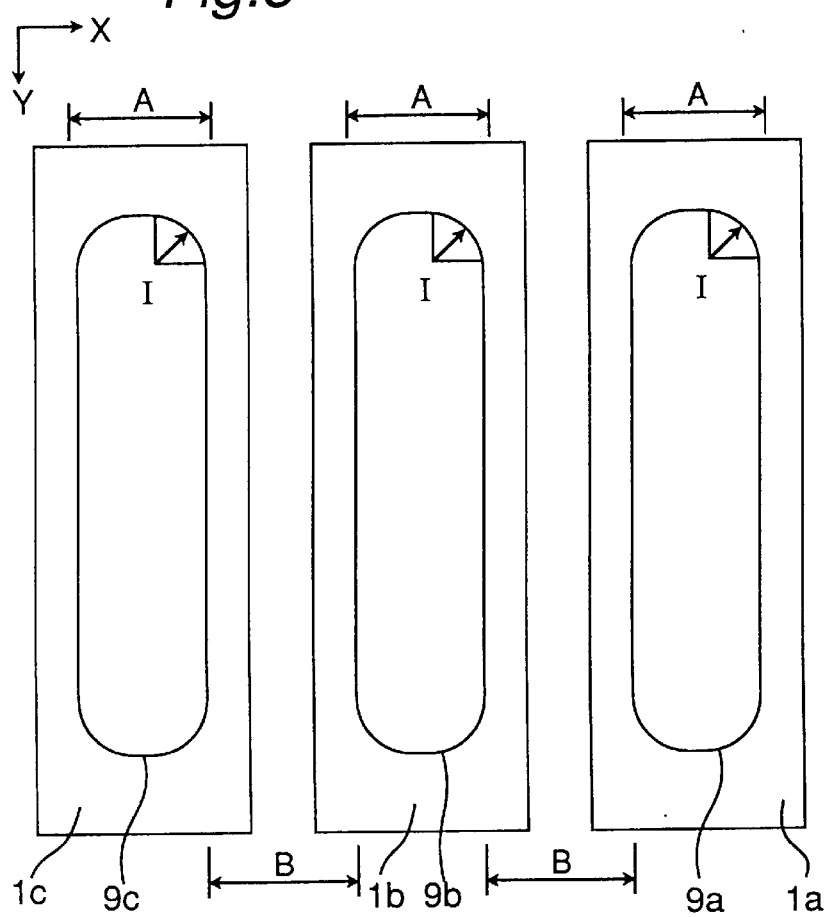
FIG. 5 is a diagram of an arrangement of an erosion formed on the surface of each target in the first embodiment.

FIG. 5 shows the location of the erosion formed on the surface of each target 1a, 1b, 1c of FIG. 1.

In FIG. 5, reference numerals 9a, 9b, and 9c represent center lines of the erosion areas 8 on the respective targets 1a, 1b, and 1c. The erosion area 8 is constituted of a combination of circular arc erosion parts of a radius (r) and linear erosion parts.

As indicated in FIGS. 1 and 5, each of a distance A between the two linear erosion parts generated on each target 1a, 1b, 1c (referred to as a "pitch A") and a pitch B of the adjacent targets 1a–1c (referred to as a "pitch B" hereinafter) are desirably 90–110% of a distance between the surface of the large-area substrate 3 and the surface of the target 1a, 1b, 1c (referred to as a "TS distance" hereinbelow).

The atoms 6 sputtered from the target 1a, 1b, 1c are radiated towards the substrate 3 with an angular distribution of cos θ from a vertical direction to the surface of the target 1a, 1b, 1c. A film thickness distribution on the substrate 3 is therefore changed large depending on the TS distance. The atoms 6 radiated from many linear erosion parts as in the present embodiment can be of a uniform amount in the linear direction (in the Y direction) of erosions when a magnetic field intensity of the line 5 of magnetic force is made constant. Therefore, approximately ±10% or lower uniformity can be achieved in the thickness distribution of the film on the substrate in the Y-axis direction. On the other hand, the atoms 6 sputtered from the erosion parts in the X-axis direction are sent onto the substrate 3 to overlap each other as shown in FIG. 1, and consequently, the film thickness distribution in the X-axis direction on the substrate 3 is greatly varied by the pitches A and B of the erosion parts of FIG. 5.

Paying attention to the above fact, the pitches A and B and the TS distance are optimized in accordance with a size of the substrate 3 and a required thickness accuracy in the first embodiment, so that nearly ±10% or lower thickness uniformity can be realized when the substrate in the X-axis direction is not larger than three times the TS distance.

If the film is to be formed on a substrate of a larger size, the target is divided by an increased number (the number is referred to as "n" hereinafter), whereby the thickness uniformity of about ±10% or lower can be attained when the size of the substrate in the X-axis direction is generally (2n–3) times the TS distance.

If the film is formed in such arrangement of the erosions that one of the pitches A and B is smaller than 90% the TS distance, an area where the formed film on the substrate 3 is uniform is narrowed. It is difficult to uniformly form the film on the large-area substrate under the above condition. In the case where one of the pitches A and B exceeds 110% the TS distance, sputtered and radiated atoms 6 are less overlapped between the erosion parts in the pitch, thereby reducing the film thickness and deteriorating the thickness uniformity.

Given that a film is formed while the substrate having its center at a position of a center point of the target 1b is set still in the basic structure in FIG. 1, with the TS distance, size of each target 1a, 1b, 1c, and structure of each magnet 2a, 2b, 2c being optimized and each of the pitches A and B of the erosions of FIG. 5 being set 90–110% of the TS distance, a simulation result of the thickness distribution at this time on the substrate 3 is shown in FIG. 2.

In FIG. 2, a position within a plane of the substrate 3 is indicated by its distance from the center of the substrate 3 on the X- and Y-axes, and a relative film thickness at each position is represented on the Z-axis. As is made apparent in FIG. 2, about ±5% thickness uniformity is achieved all over the large-area substrate 3 not only in the Y-axis direction, but in the X-axis direction. A total area of all the divided electrodes determined by the size and pitch B of the targets 1a–1c is approximately twice or smaller the area of the substrate.

Figure 9:
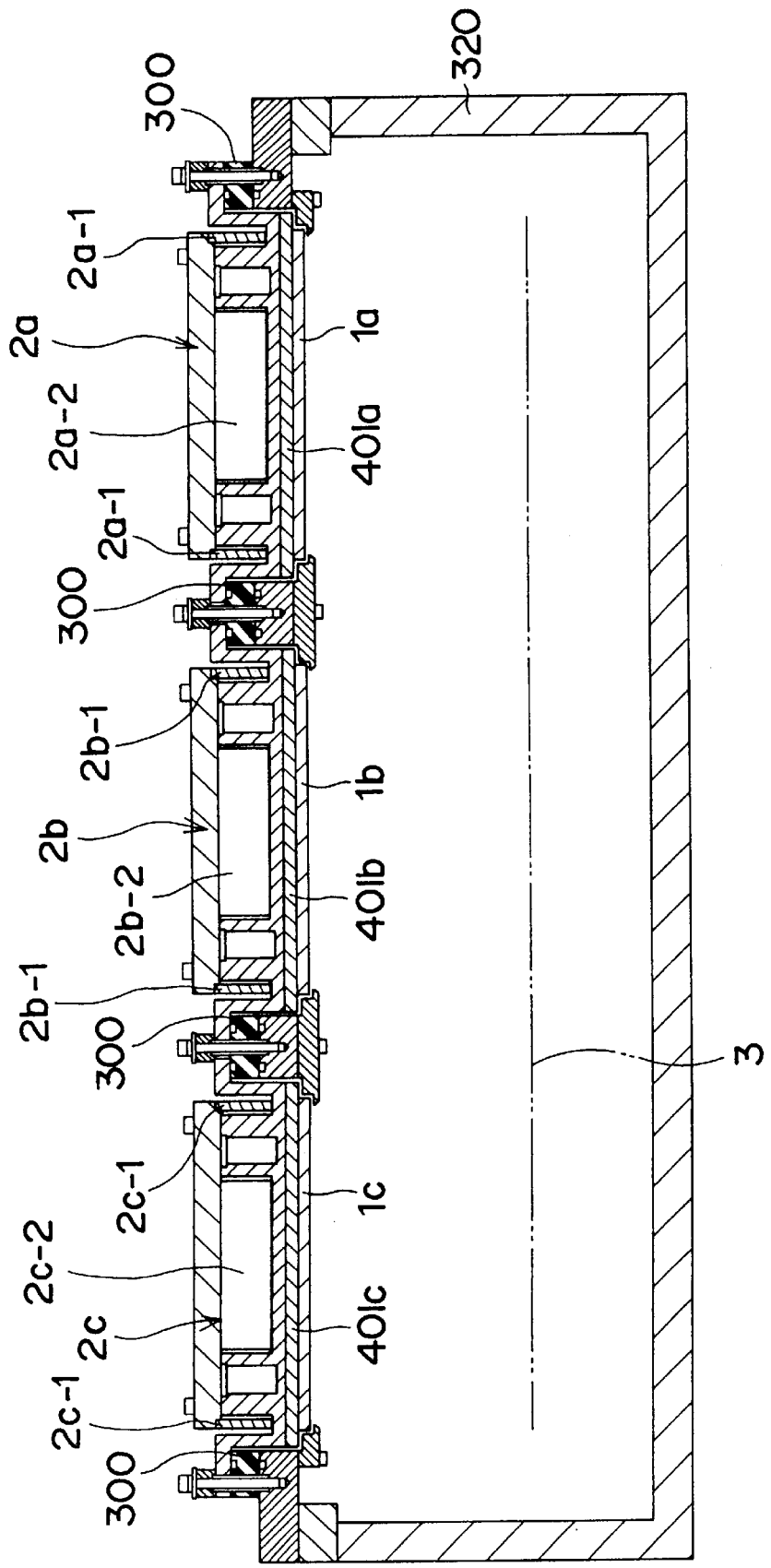
FIG. 9 is a sectional view showing the apparatus of FIG. 1.

The divided targets 1a, 1b, and 1c are electrically insulated from each other and a wall of a vacuum chamber 320 by insulating members 300 in the embodiment as shown in FIG. 9, so that the targets can be controlled independently of each other by the corresponding variable power sources 4a, 4b, and 4c. A decrease of the film thickness rather easy to occur at end parts of the substrate than at the central part of the substrate in the X-axis direction can be restricted by controlling the variable power sources 4a–4c, and even the thickness uniformity of ±3% or so can be fulfilled all over the large-area substrate 3. Supposing that the impressed power from the power source 4b at this time is 100%, the above thickness uniformity can be achieved by increasing the power of each power source 4a, 4c to 120% or so. Alternatively, in some cases, supposing that the impressed power from the power source 4b at that time is 100%, the above thickness uniformity can be achieved by either decreasing the power of each power source 4a, 4c to 80% or so, or applying the same power of each power source 4a, 4c.

A stable uniform film can be also formed with the utilization of an RF power source (high frequency power source) as the power source 4a, 4b, 4c when an insulating material besides a metal such as aluminum or the like is used for the material of the targets 1a–1c. In this case, a matcher is fitted for each electrode having the target 1a, 1b, 1c, thereby controlling and matching the electrodes independently. Moreover, when a phase shifter or the like control unit is set between the RF power source 4a, 4b, 4c and the matcher, the film-forming speed is controllable.

A second embodiment of the present invention will be discussed with reference to the drawings.

Figure 6:
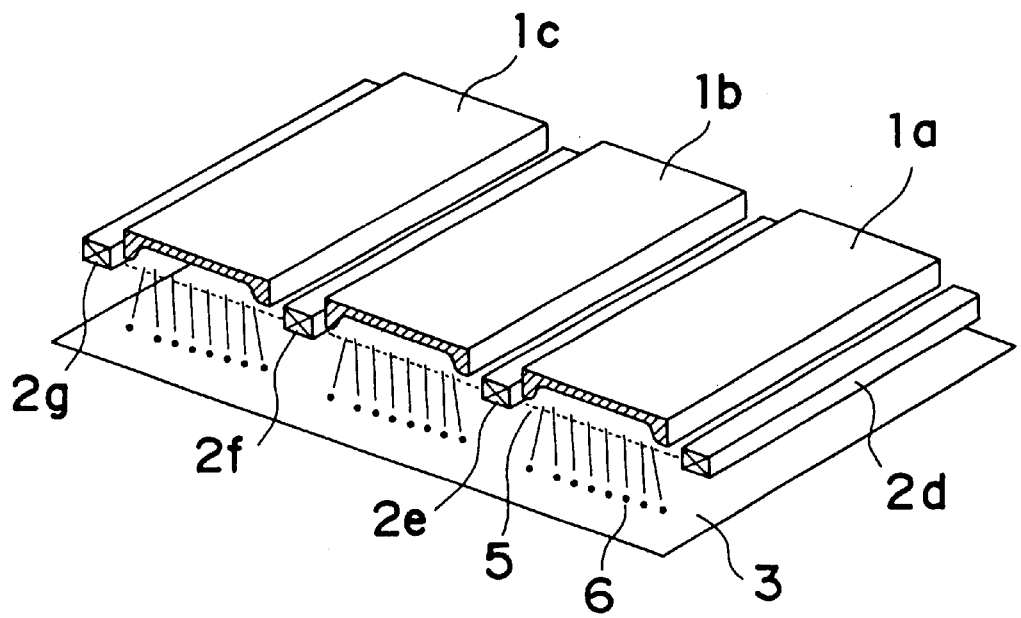
FIG. 6 is a perspective sectional view of a sputtering apparatus in the basic constitution according to a second embodiment of the present invention.
Figure 7:
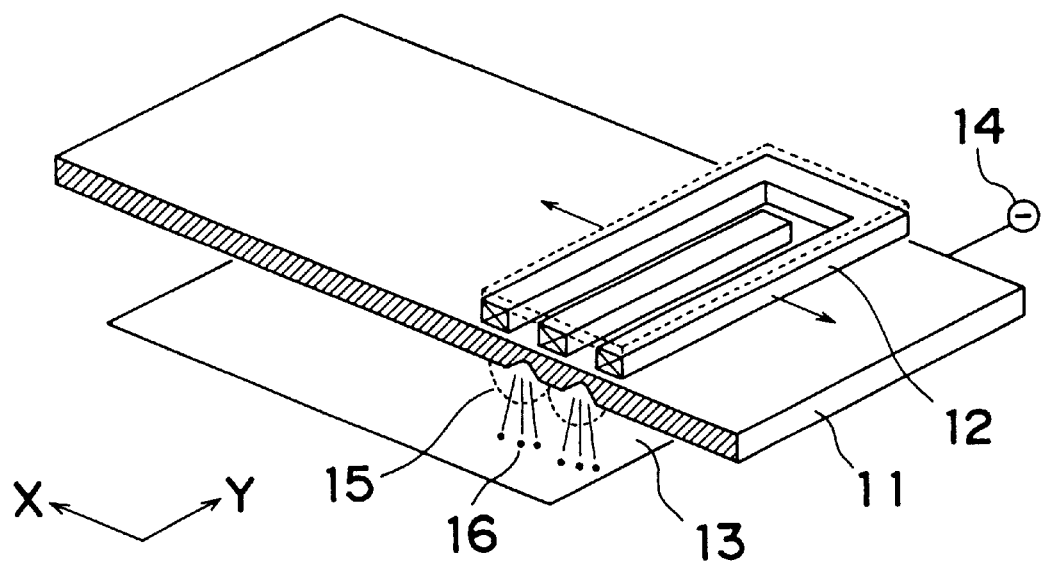
FIG. 7 is a perspective sectional view of a conventional sputtering apparatus in the basic constitution.
Figure 8:
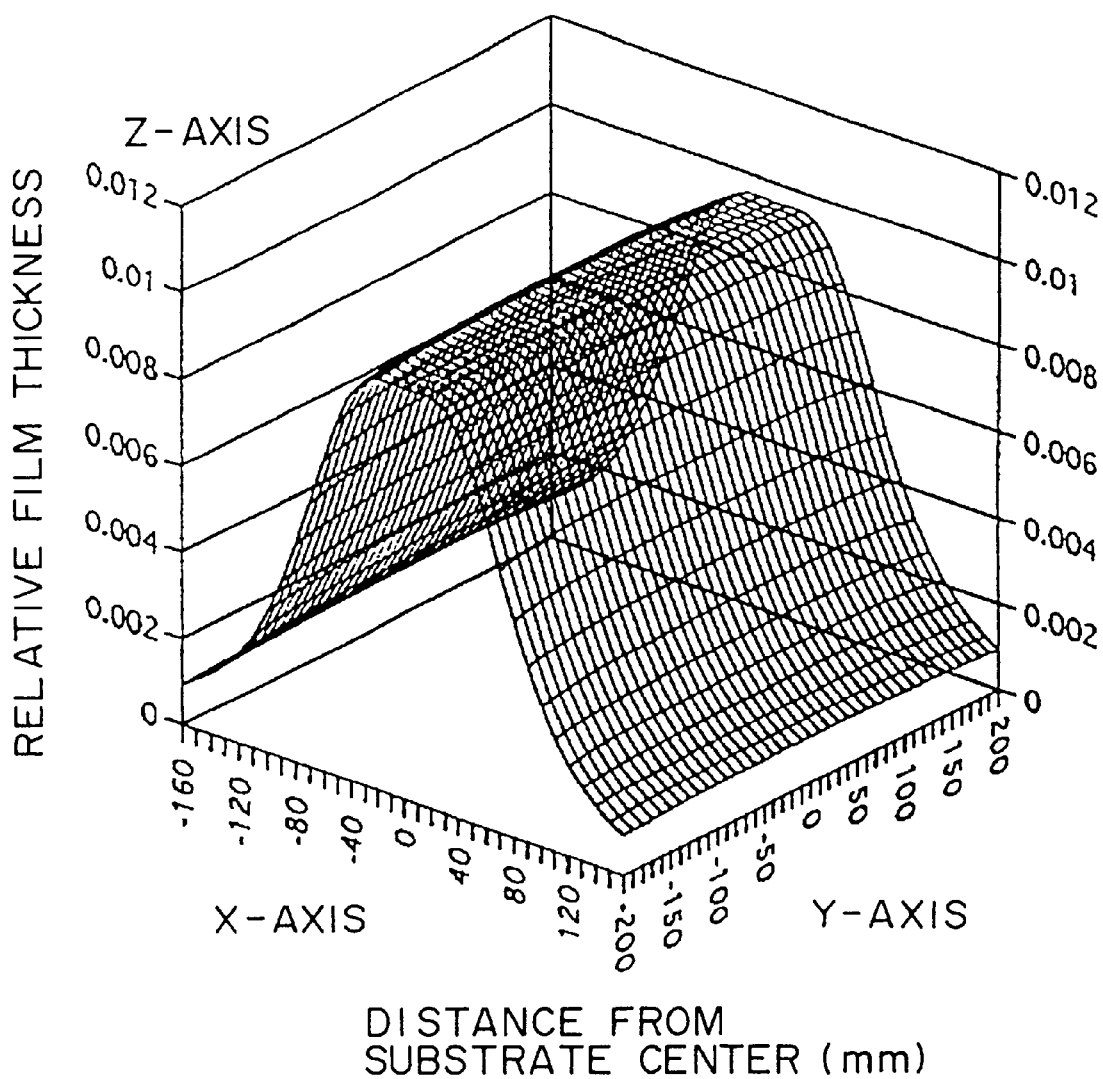
FIG. 8 is a diagram of a simulation result of a thickness distribution of a film formed on a substrate when a magnet is laid still at a position of a center point of the substrate in the conventional sputtering apparatus.

FIG. 6 is a perspective sectional view showing the basic structure of an apparatus of the stationary model for forming a film by sputtering to a large-area substrate according to the second embodiment of the present invention.

Figure 10:
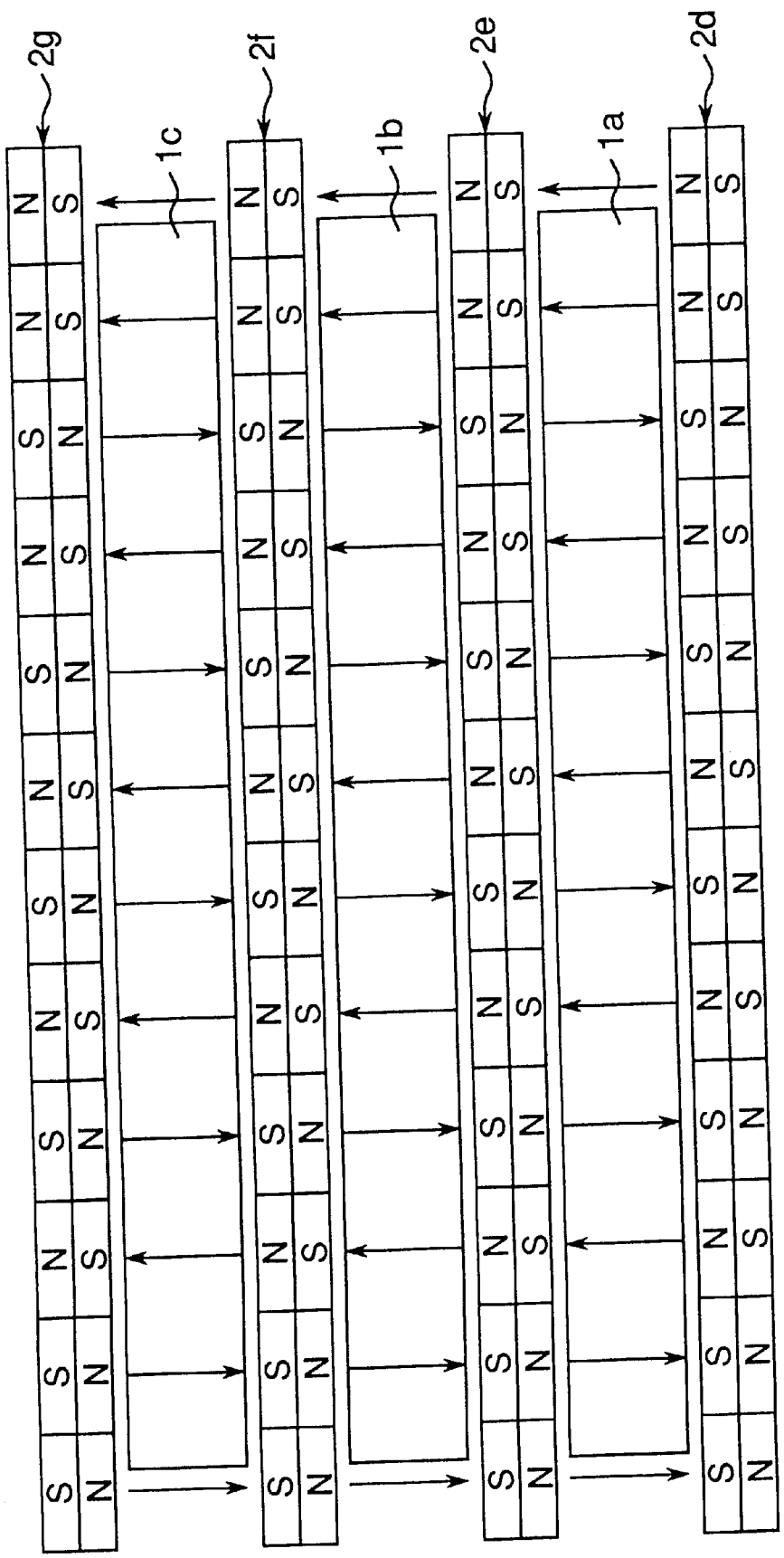
FIG. 10 is a plan view showing arrangement of poles of the three magnets on the three targets.
Figure 11:
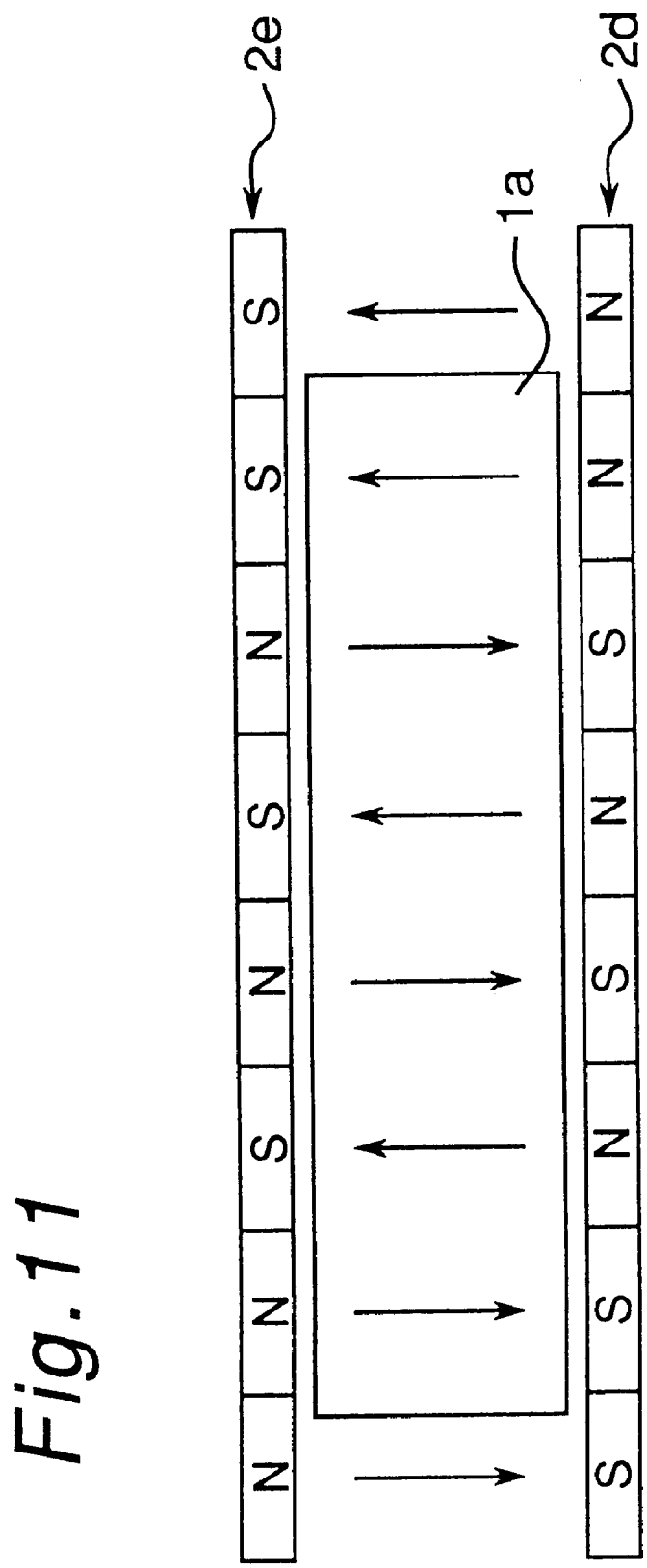
FIG. 11 is a plan view showing arrangement of pole s of one magnet on the target.

Referring to FIG. 6, references are: 1a, 1b, 1c each one of a target divided to three; 2d–2g linear fixed magnets set at both sides of the targets 1a–1c; 3 a large-area substrate; 5 a line of magnetic force generated on the target 1a by the magnets 2d and 2e; and 6 atoms of a target material sputtered from on the target 1a, 1b, 1c. The similar lines 5 of magnetic force are generated between the magnets 2e and 2f and between the magnets 2f and 2g. The poles of the linear fixed magnets 2d–2g are shown in FIG. 10 and the principle of the pole arrangement is shown in FIG. 11. The pole arrangement is so constituted that electrons are not flown out of the target.

The operation of the apparatus will now be described.

In FIG. 6, argon gas (a reaction gas is added to the argon gas in case of reactive sputtering) is introduced in a vacuum chamber (not shown). While a vacuumization efficiency and a gas flow rate are controlled to make a gas pressure constant, the electric powers are applied from the power sources (not shown) to the electrode parts including the targets 1a, 1b, and 1c in the same manner as in FIG. 1. In consequence, molecules of the introduced gas are turned to a plasma state. The electrons in the plasma drift over the targets 1a, 1b, and 1c in a vertical direction to the line 5 of magnetic force and an electric field from the targets 1a–1c, because of a Lorentz force consequent to the mutual action between the line 5 of magnetic force parallel to the surface of each target by the magnets 2d–2g and the electric field from the targets 1a–1c.

At this time, when the polarities of the linear fixed magnets 2d–2g are inverted, the drifting direction of the electrons is inverted. Therefore, when the interior of each fixed magnet 2d, 2e, 2f, 2g is constituted of divided magnets to obtain an optimum polarity distribution, a density of electrons is prevented from being locally increased on the targets 1a–1c.

As a density distribution of electrons is uniformed on the targets 1a, 1b, and 1c, a uniformed density distribution of plasma can be achieved.

Since the surface of each target 1a, 1b, 1c has a minus potential by the DC power source or RF power source, the argon ions having positive charges in the plasma move straight to collide the targets 1a–1c with a large motion energy, thereby sputtering target atoms 6. As a result, the target material is not partially eroded on each target 1a, 1b, 1c owing to a uniformed density of plasma where argon ions are present, thus generating an erosion in a wide area. The sputtered atoms 6 from the eroded part adhere onto the flat substrate 3 set at a position opposite to a plane including the targets 1a, 1b, and 1c. A thin film is obtained in the manner as above.

According to the second embodiment, in the directions of the lines 5 of the magnetic force and the directions of drifting electrons due to the targets 1a–1c, for preventing the electrons from flowing outside from each target at both ends of the target 1a, 1b, 1c in a longitudinal direction, polarities at both ends of each of the linear fixed magnets 2d–2g are determined so as to allow the electrons to drift in a direction to the center of the target. Accordingly, the plasma density can be improved and many atoms 6 can be simultaneously sputtered from the whole surface of the target. That is, the film can be formed at high speeds.

When the magnetic fields generated on the targets at both sides of each magnet 2e, 2f (namely, on the targets 1a, 1b and 1b, 1c) are inverted in direction, the line 5 of magnetic force can be generated on the targets at both sides of the magnet only by the linear fixed magnet having a pair of N and S poles.

By using the sputtering electrodes in the constitution of the second embodiment, even when the distance between the large-area substrate 3 and the surface of the target 1a, 1b, 1c (TS distance) is shortened as compared with the first embodiment, a uniform film thickness is easily ensured on the substrate 3. Therefore, an amount of sputtered atoms 6 adhering to other parts than the substrate 3 is reduced and the film is formed quickly. Furthermore, a utilization efficiency and a life of each target 1a, 1b, 1c can be improved.

A third embodiment of the present invention will be described with reference to the drawings.

Figure 12:
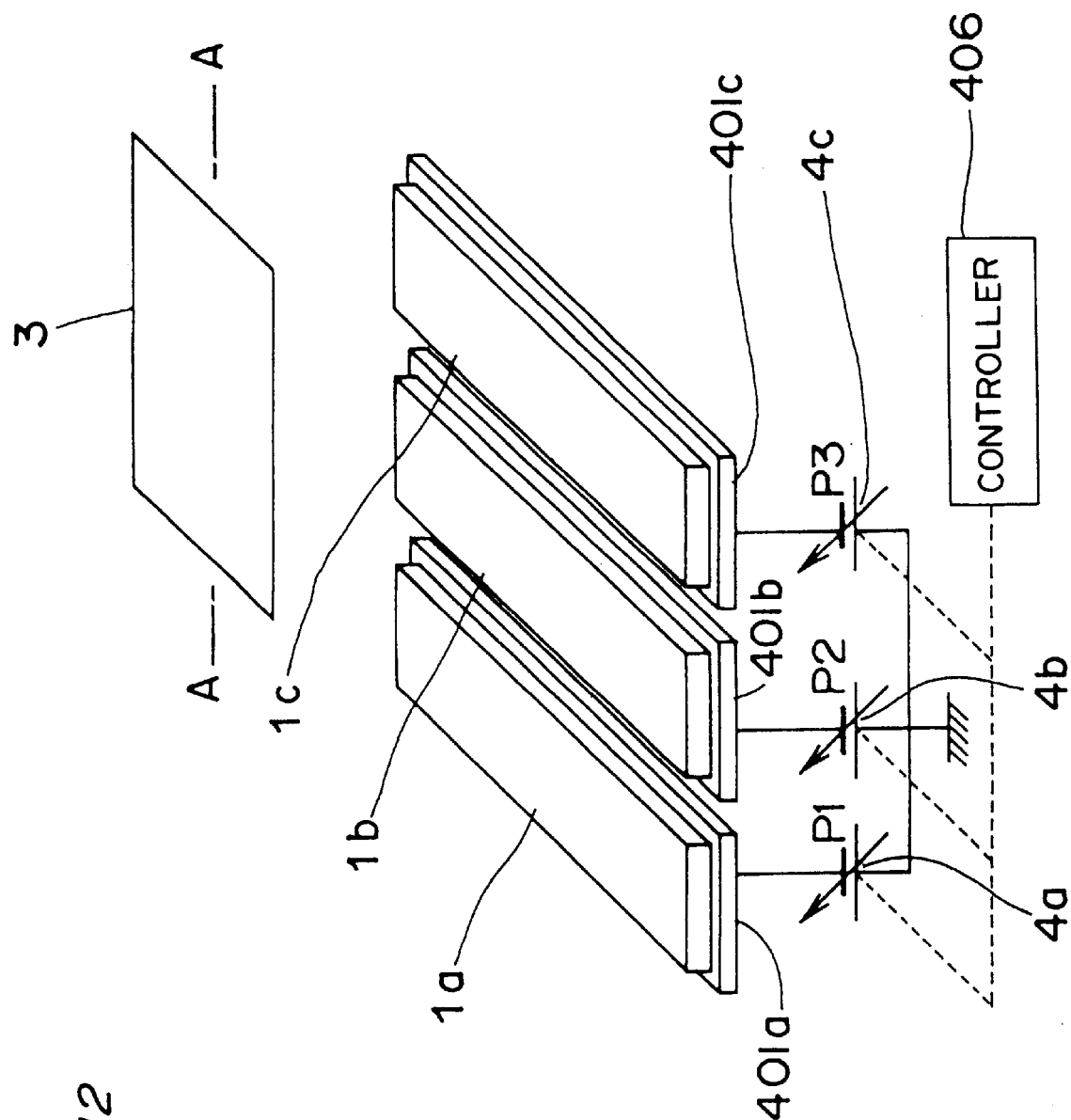
FIG. 12 is a view of a third embodiment of the present invention.

FIG. 12 shows a typical example of a third embodiment of the present invention. In the example, three electrodes 401a, 401b, 401c and the three targets 1a, 1b, 1c are disposed via an equal distance as shown in FIG. 12. There are also arranged power sources 4a, 4b, 4c connected to the respective electrodes 401a, 401b, 401c, the substrate 3 opposed to the targets 1a, 1b, 1c and a control device 406 for controlling the powers to be impressed to each power source.

The operation of a sputtering apparatus constructed as above will now be depicted below.

Figure 13:
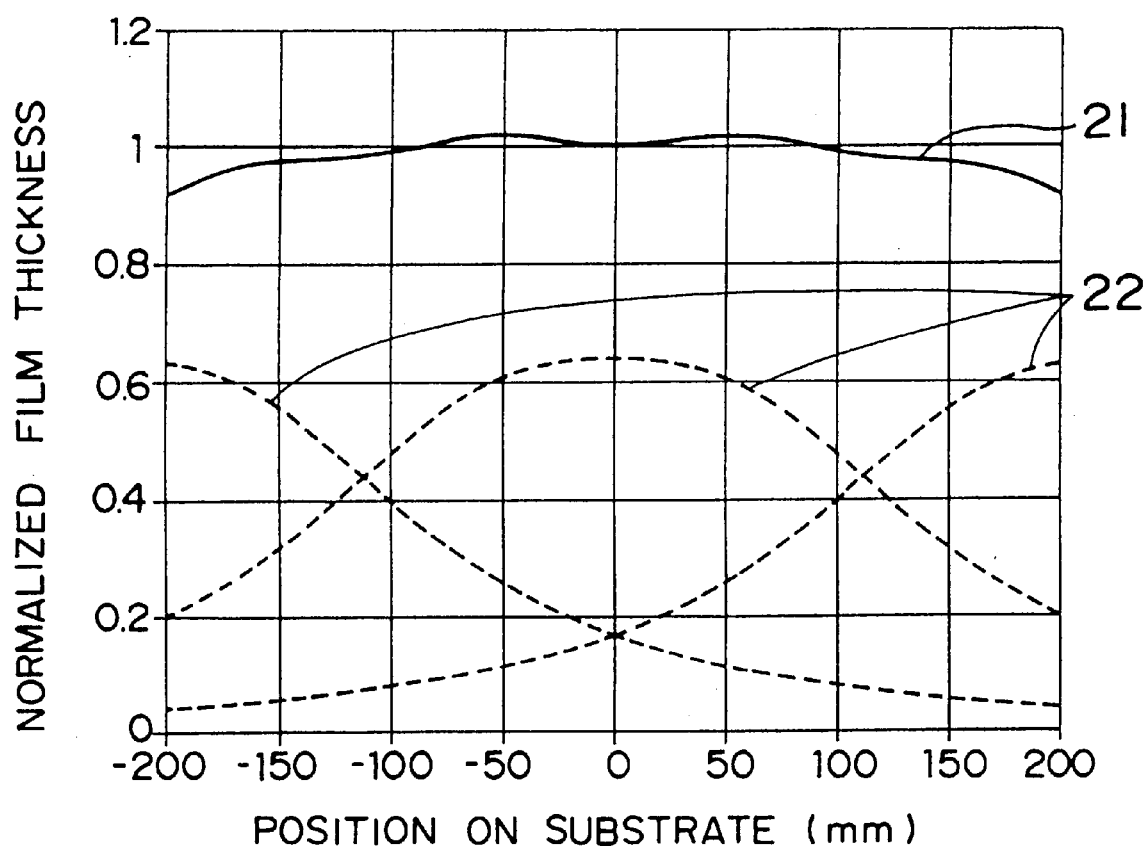
FIG. 13 is a diagram of the simulated thickness distribution of films formed when the power is impressed uniformly to the same erosion parts spaced an equal distance.

FIG. 13 indicates simulation results of the film thickness on the assumption that the powers are impressed uniformly to the electrodes 401a–401c in the third embodiment. The film thickness is normalized based on the film thickness of 1 at a central part of the substrate 3. A solid line 21 in FIG. 13 shows the film thickness at a cross section on the substrate 3 along a line A—A in FIG. 12. Meanwhile, broken lines 22 in FIG. 13 represent the simulated thickness of films independently obtained from the targets 1a–1c. The solid line 21 is accordingly the sum of the broken lines 22. As is clear from FIG. 13, the thickness at each of both end parts of the substrate 3 is smaller than that at the central part.

Figure 14:
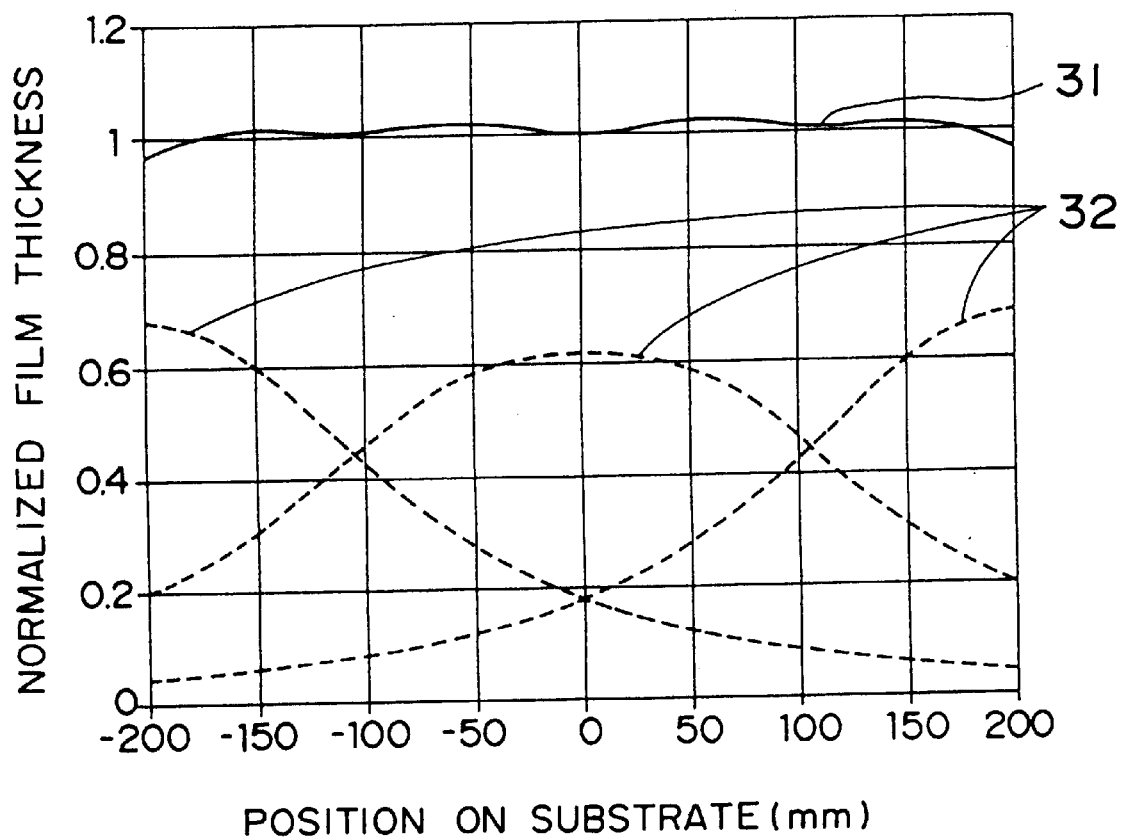
FIG. 14 is a diagram of the simulated thickness distribution of films formed when the power impressed to each of both end electrodes in FIG. 13 is increased 12%.

FIG. 14 results from the condition that the powers impressed to the electrodes 401a, 401c at both ends are changed. The powers impressed to the electrodes 1a, 1c at both ends are increased 12% as compared with the power impressed to the central electrode 1b, as indicated by broken lines 32 in FIG. 14. Consequently, a decrease in the film thickness at each end part of the substrate as represented by the solid line 21 in FIG. 13 is solved as is indicated by a solid line 31. While the film thickness uniformity within a plane of the substrate in FIG. 13 is ±8%, that is improved to ±4% in FIG. 14.

The thickness of the film obtained separately from the target 1a, 1b, 1c shown by the broken line 22 in FIG. 13 actually varies depending on the material of the target, kind of gas, film-forming pressure, discharge powers, and distance between the target and substrate. When the film-forming pressure is high or the distance between the target and substrate is large, the broken line 22 tends to be more moderate. The film is formed further uniformly in FIG. 14 if the power is increased more than 12%. On the other hand, if the film-forming pressure is low or the distance between the target and substrate is small, the increasing amount of 12% is reduced, whereby the film can be formed more uniformly in some cases.

Figure 15:
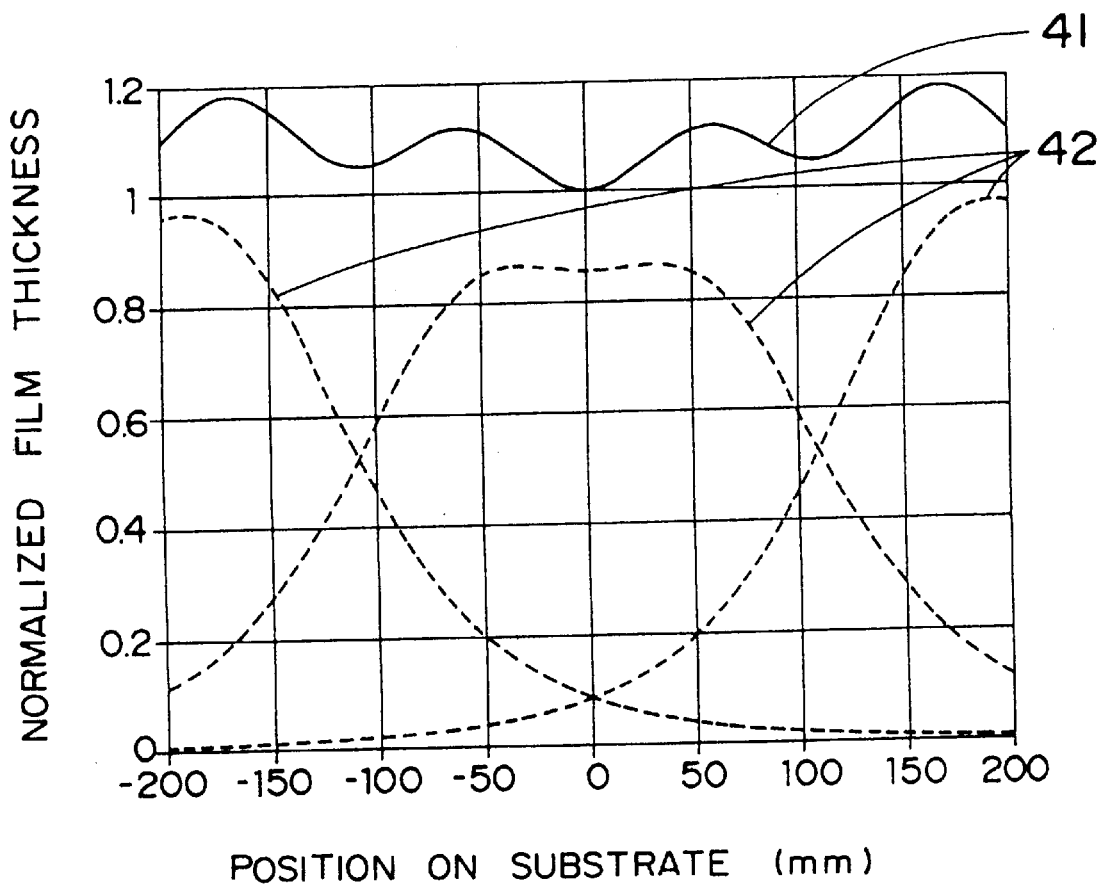
FIG. 15 is a diagram of the thickness distribution of films continued to be formed nearly to the last stage of the life of targets without controlling the power from a state of FIG. 14.
Figure 16:
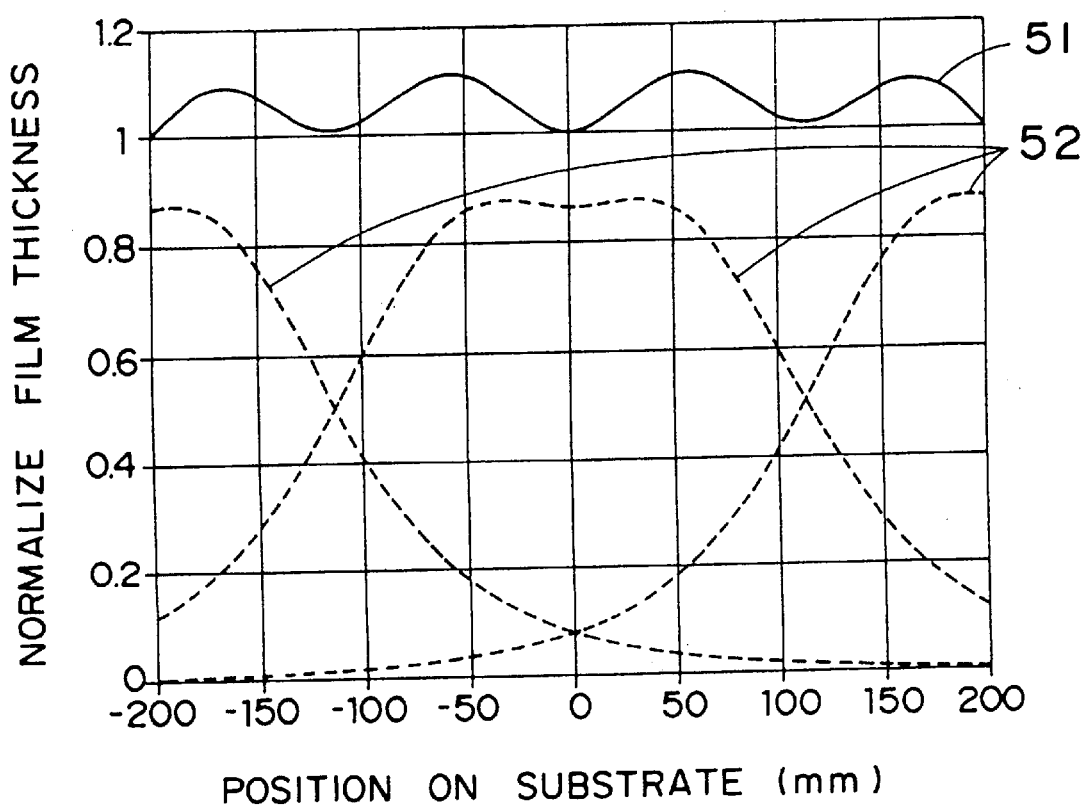
FIG. 16 is a diagram of the thickness distribution of films when the thickness uniformity is improved by controlling the power in FIG. 15.

FIG. 15 indicates an example of the change of the film thickness distribution with time from FIG. 14, in which the scattering angle of particles from each erosion is smaller than in FIG. 14 as a result of the local consumption of the target. If the powers impressed to the electrodes 1a, 1c at both ends are increased in the same manner as discussed above, the film thickness on the substrate at each end part becomes slightly larger than that at the central part as shown in FIG. 15. For solving this inconvenience, the power impressed to each end electrode is controlled thereby to secure the uniformity, as exemplified in FIG. 16. In FIG. 16, the power applied to each end electrode is made equal to the power impressed to the central electrode as indicated by a broken line 52, so that the film thickness uniformity on the substrate is ensured. When the powers impressed to the peripheral electrodes are controlled to the power impressed to the central electrode in accordance with the consumption of the targets, the thin film can be formed uniformly on the substrate from the initial stage to the last stage of the life of the target.

Figure 17:
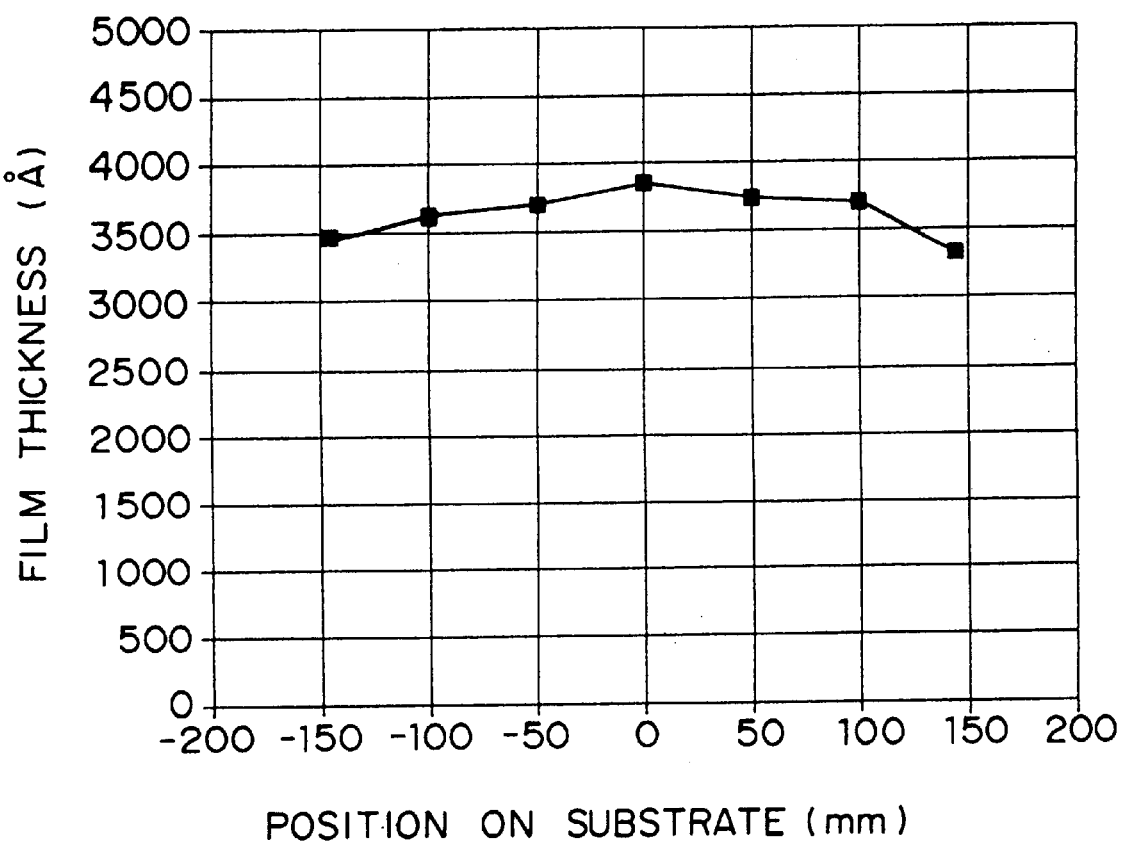
FIGS. 17, 18, 19, and 20 are diagrams of experimental results based on the present invention.
Figure 18:
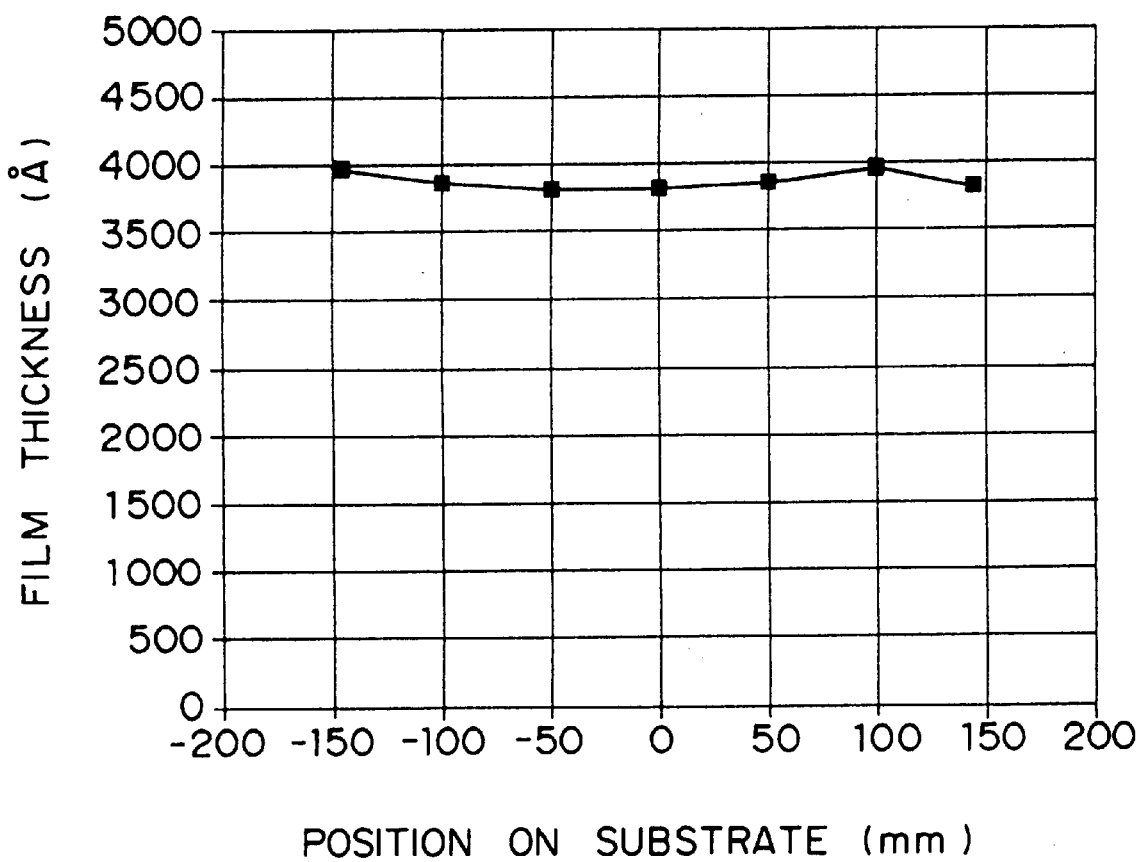
Figure 19:
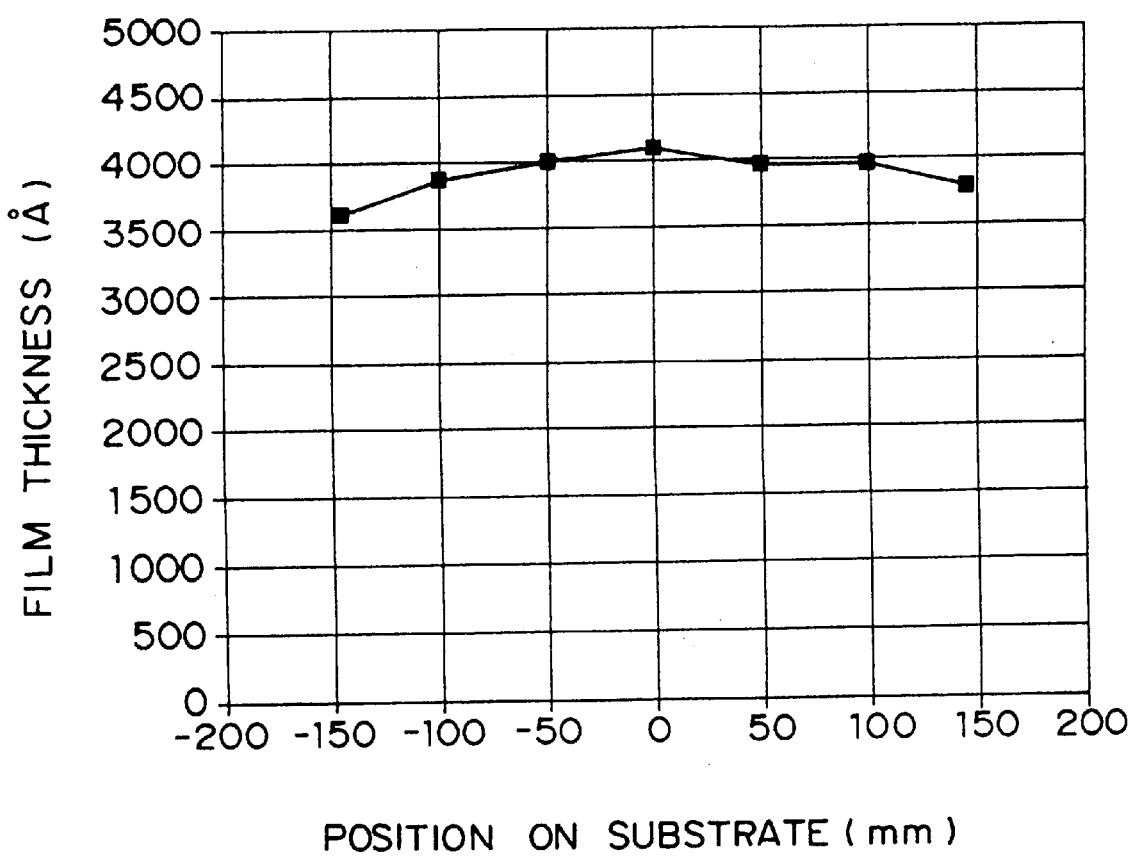
Figure 20:
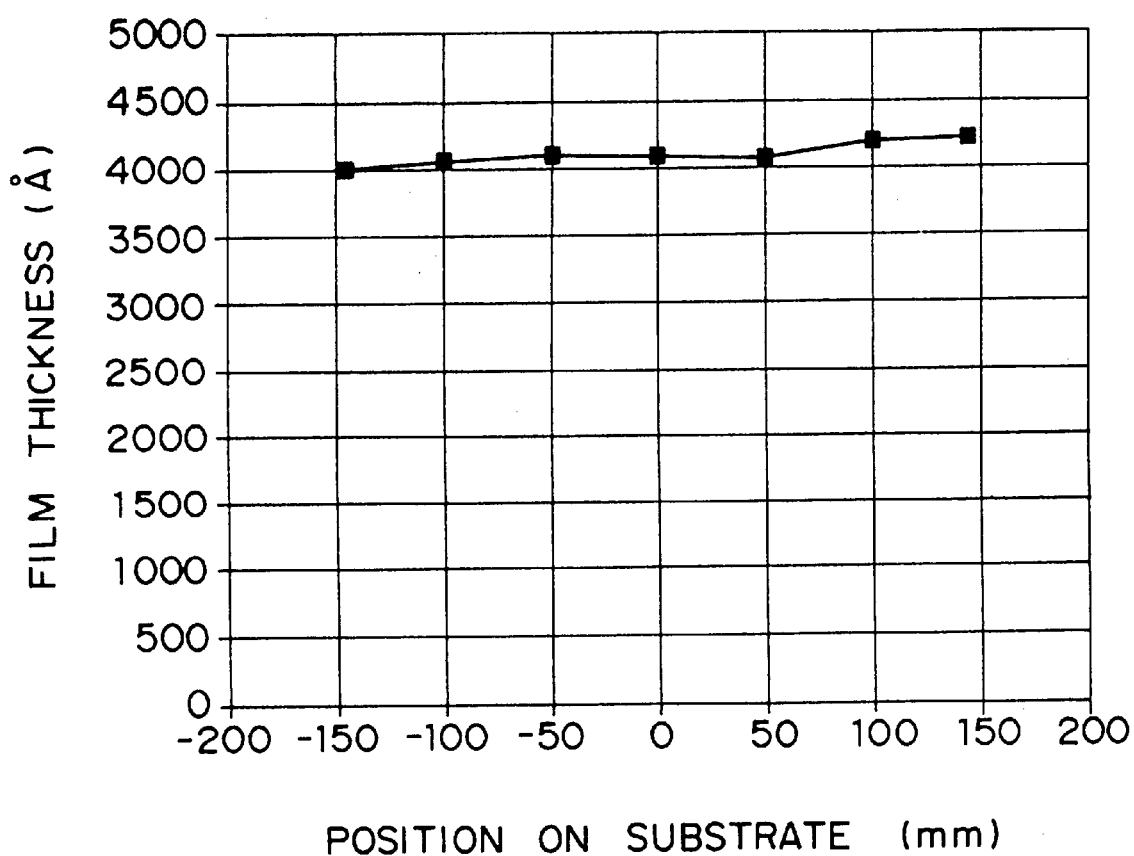
Figure 21:
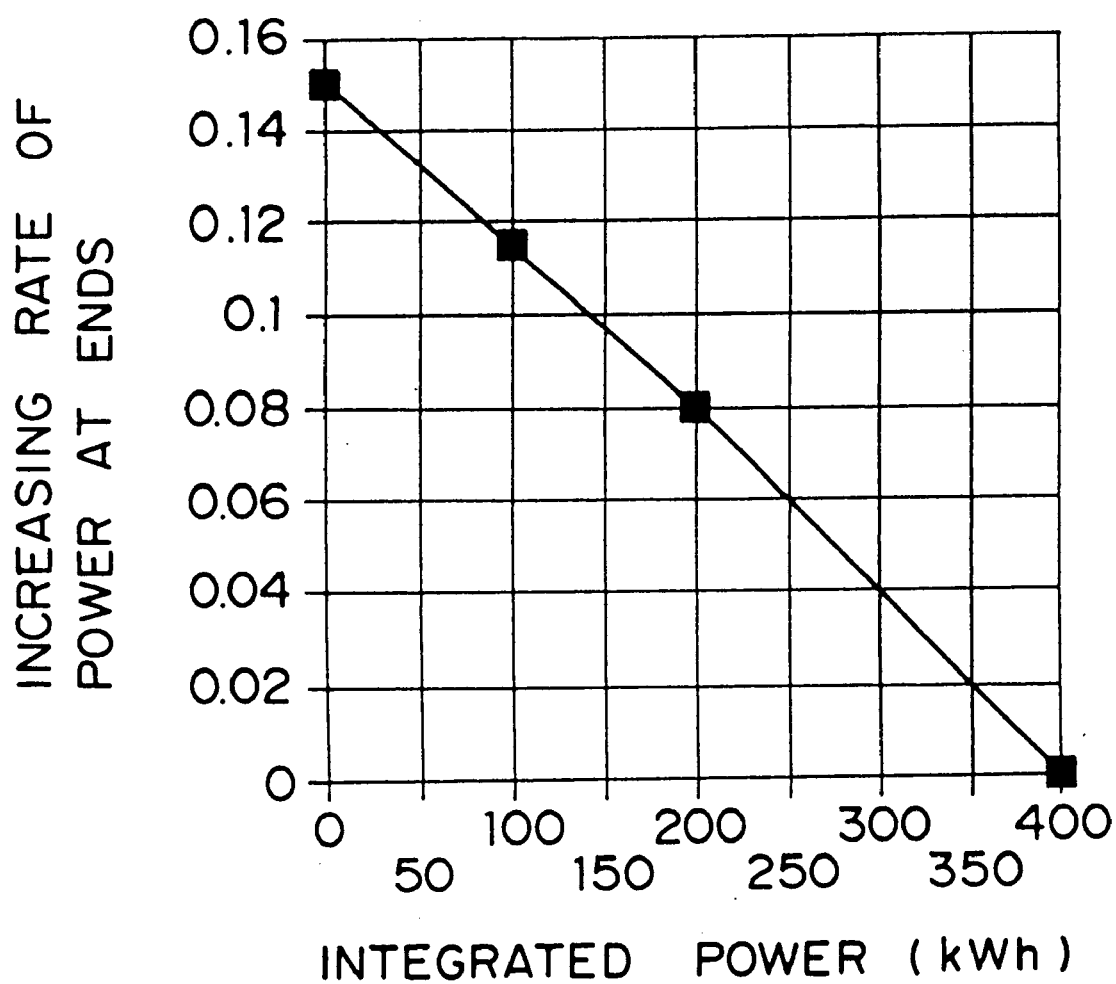
FIG. 21 is a diagram showing an example where the powers for impressing to the end electrodes are controlled based on the experimental results of FIGS. 17–20.

The actually formed film according to the present embodiments will be described. In order to form a film on the substrate of a size of 320 mm×400 mm, three targets each having a size of 150 mm×650 mm were used, and the distance between the targets was set to be 103 mm. Essential conditions when the film was formed are as follows:

Film-forming pressure: 7 mTorr
Flow rate of gas: Ar 40 sccm
Each of three Film-forming powers: 4 kw The thickness distribution of the film formed when the power was equally applied to each target is shown in FIG. 17. In the drawing, the film thickness at each end part of the substrate is decreased slightly, similar to FIG. 13. Since the optimum powers to be impressed to both end targets were estimated to be 4.6 kW (±15%) through comparison of this thickness distribution with the simulation result, and when the film was actually formed with this power, the improvement in thickness uniformity was observed as is shown in FIG. 18. The formation of the film was subsequently continued after the power was returned to be equal for each of the targets. The resulting film was evaluated again when the integrated powers applied to the targets were 100 kWh. The erosion was found to be approximately 2 mm deep and the thickness distribution became as shown in FIG. 19. Although the film thickness at each end part was still smaller than that at the central part of the substrate in FIG. 19, it was slightly increased in comparison with that at the initial stage of the film formation. Thereafter, the optimum power for each end target was estimated by comparing the thickness distribution with the simulation result, which was 4.44 kW (+11%). Then, the film was actually formed with this power and the thickness uniformity was detected to be improved as is indicated in FIG. 20. By repeating the above process, the optimum increasing amount of power to the integrated power was found to satisfy an equation:

[Increasing amount of power (%)]=15−0.04 [integrated power (kWh)]

In this case, when the depth of the erosion is used as a parameter, the optimum increasing amount will be expressed as follows:

[Increasing amount of power (%)]=15−0.04 [erosion depth (mm)]

In any of the foregoing embodiments, the film thickness is uniformed by controlling the power(s). However, the film thickness can be uniformed by the film-forming time as well. Thus, the variable power supplies are operable to supply power to the electrodes such that a difference between the levels of power supplied, or between the amounts of the time the power is supplied, to the side electrodes and the center electrode are controlled based on respective consumption amounts of the targets with time. Moreover, although three electrodes are aligned on a line in every embodiment here, four or more electrodes may be used and arranged not on a line, but in matrix or concentrically.

The sputtering apparatus of each of the embodiments of the present invention is constructed in a cathode structure having angular divided targets electrically insulated from each other, with a magnet disposed for each target to generate a predetermined line of magnetic force at a front surface of the target. In the constitution as above, a film can be obtained totally uniformly all over a large-area substrate without sliding the magnets. A stability of a film thickness distribution in the X-axis direction is improved, and sputtering is executed simultaneously from many erosion parts, thereby less decreasing a film-forming speed. An impedance can be stabilized and matched for each target independently even during the discharge by a high frequency power source, and therefore a thin film can be formed stably even when an insulating target is used.

Moreover, since an annular closed erosion is constituted of a combination of linear and circular arc erosion parts by the magnet disposed at the rear surface of each target, a plasma density is improved by trapping of electrons on each target, whereby the film-forming speed is improved. When a distance between the linear erosion parts and a pitch of adjacent targets are set to be 90–110% of a distance between the substrate and the surface of the target, the total area of the divided electrodes is minimized to an area of the substrate, so that the vacuum chamber becomes compact in size.

In addition, if a film is to be formed on a large-area substrate, many divided targets are usable to form the film uniformly. A maintenance easiness or readiness to exchange the target is improved because of a reduced weight of the divided target, and the target can be manufactured at lower costs.

Further, since linear magnets are arranged at both sides of the target and electrode, not at the rear surface of the target, the structure becomes optimum without forming a partial density distribution of electrons on the surface of the target, and accordingly an erosion area on the target is increased. As a result, a utilizing efficiency and a life of the target are improved and film-forming costs are decreased.

The sputtering apparatus of the present invention can form a film stably on an angular substrate of a large area while miniaturizing the target or vacuum chamber. Therefore, the equipment cost and material cost are reduced and an operating capability is improved because the maintenance work is carried out efficiently.

The annular closed erosion formed of a combination of linear and circular arc erosion parts is obtained by the magnet arranged at the rear surface of each target, which enables simultaneous sputtering from the targets. Thus, the film formation at high velocity is achieved by the power source of even low performance. A productivity is hence improved. At the same time, since a stable RF magnetron discharge is applicable to the apparatus other than the DC discharge, not only a metallic target, but a target of an insulating material may be used.

When each of the distance of linear erosion parts and the pitch of angular electrodes is set to be 90–110% of the distance between the substrate and the surface of the target, while the size of each target and the dividing number of the target are made optimum to fit for the size of the angular large-area substrate, the film of superior thickness uniformity is obtained. A production yield is expected to be improved.

Since the linear magnets are disposed at both sides of the target and electrode, not at the rear surface of the target, the electrons are not partially distributed on the surface of the target, whereby a using efficiency and a life of the target are improved and also a running cost and a maintenance frequency can be reduced.

With the use of the film-forming method of the embodiment of the present invention which improves the thickness uniformity of films formed in the sputtering apparatus, it becomes possible to form films of high thickness uniformity stably from the initial stage to the last stage of the life of the target. A magnet slide or the like is hence eliminated, simplifying the apparatus in structure. Moreover, stable matching is achieved even during the high frequency discharge, so that films of an insulating target material or compound thin films can be stably formed through reactive sputtering.

Since the powers to be impressed to the peripheral targets are controlled, for example, by measuring the shape of the surface of the targets, films of high uniformity are obtained stably at all times correspondingly to the circumstances of the chamber.

The thickness of the produced thin film is uniformed, for example, in a manner of monitoring the thickness occasionally thereby to control the power to be impressed to the peripheral targets. It is more effective to uniform the thickness if the thickness of the film formed by a single target is measured thereby to obtain the power to be impressed to the peripheral targets.

As described above, according to the present invention, since a plurality of small targets are used to a substrate of a large area, a film is formed uniformly all over the surface of the substrate from the initial stage to the last stage of the life of the targets.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A sputtering apparatus for use in forming a film on a substrate in a vacuum chamber into which gas can be supplied, said sputtering apparatus comprising:

three discrete, separated electrodes, including a center electrode and two side electrodes disposed on opposing sides of said center electrode;

three discrete, separated targets disposed at said electrodes, respectively, and including a center target and two side targets on opposing sides of said center target;

three discrete, separated magnets arranged adjacent said three targets, respectively, in positions for generating lines of magnetic force on surfaces of said targets, respectively;

a supporting, part for supporting the substrate to face said three targets such that the substrate is fixed in position relative to said three targets; and variable power supplies operably connected to said electrodes for supplying power to said electrodes such that a difference between the levels of power supplied, or between the amounts of time the power is supplied, to said side electrodes and said center electrode is controlled based on respective consumption amounts of said targets with time;

wherein vertical distances between said targets and respective portions of the substrate supported by the supporting part are the same;

wherein said targets and said magnets are arranged so that each of said targets is subject to an annular closed erosion constituted of a combination of linear erosion parts and circular arc erosion parts, and such that distances between the linear erosion parts of said targets and a pitch of said targets are 90–110% of distances between the substrate as supported by said supporting part and the surfaces of said targets.

2. The sputtering apparatus according to claim 1, wherein said magnets are arranged at rear surfaces of said targets, respectively, so as to allow electrons to drift in annular confinements on the surfaces of said targets.

3. The sputtering apparatus according to claim 2, wherein said supporting part is operable to hold a substrate which is flat and of a shape having angles.

4. The sputtering apparatus according to claim 1, wherein said magnets comprise linear magnets placed at opposing sides of said electrodes and said targets.

5. The sputtering apparatus according to claim 1, wherein said electrodes are electrically insulated from each other.

6. The sputtering apparatus according to claim 1, wherein said three targets and said supporting part are arranged relative to one another so as to allow overlaps of sputtering from said three targets onto the substrate.

7. The sputtering apparatus according to claim 1, wherein said variable power supplies are operable for supplying the power to said electrodes such that initially the levels of power, or amounts of time the power is supplied, to said side electrodes are greater than that to said center electrode and, subsequently with consumption of said targets, the levels of power, or amounts of time the power is supplied, to said side electrodes are reduced toward being equal to that to said center electrode.

8. The sputtering apparatus according to claim 1, wherein said variable power supplies are operable for supplying the power to said electrodes such that initially the levels of power, or amounts of time the power is supplied, to said side electrodes are greater than that to said center electrode and, subsequently with consumption of said targets, the levels of power, or amounts of time the power is supplied, to said side electrodes are reduced to be equal to that to said center electrode.

9. A sputtering method for forming a film on a substrate in a vacuum chamber into which gas can be supplied, said sputtering method comprising:

providing three discrete, separated electrodes, including a center electrode and two side electrodes disposed on opposing sides of said center electrode;

providing three discrete, separated targets disposed at said electrodes, respectively, and including a center target and two side targets on opposing sides of said center target;

providing three discrete, separated magnets arranged adjacent said three targets, respectively, in positions for generating lines of magnetic force on surfaces of said targets, respectively;

supporting the substrate to face said three targets such that the substrate is fixed in position relative to said three targets and such that vertical distances between said targets and respective portions of the substrate are the same; and variably supplying power to said electrodes such that a difference between the levels of power supplied, or between the amounts of time the power is supplied, to said side electrodes and said center electrode is controlled based on respective consumption amounts of said targets with time;

wherein, in said providing of said three discrete, separated targets and said providing of said three discrete, separated magnets, said targets and said magnets are arranged so that each of said targets is subject to an annular closed erosion constituted of a combination of linear erosion parts and circular arc erosion parts, and such that distances between the linear erosion parts of said targets and a pitch of said targets are 90–110% of distances between the substrate as supported by said supporting part and the surfaces of said targets.

10. The sputtering method according to claim 9, wherein said providing of said three targets and said supporting of the substrate are carried out so as to allow overlaps of sputtering from said three targets onto the substrate.

11. The sputtering method according to claim 9, wherein said variably supplying power to said electrodes is such that initially the levels of power, or amounts of time the power is supplied, to said side electrodes are greater than that to said center electrode and, subsequently with consumption of said targets, the levels of power, or amounts of time the power is supplied, to said side electrodes are reduced toward being equal to that to said center electrode.

12. The sputtering method according to claim 9, wherein said variably supplying power to said electrodes is such that initially the levels of power, or amounts of time the power is supplied, to said side electrodes are greater than that to said center electrode and, subsequently with consumption of said targets, the levels of power, or amounts of time the power is supplied, to said side electrodes are reduced to be equal to that to said center electrode.

* * * * *

UNITED STATES PATENT AND TRADEMARK OFFICE
CERTIFICATE OF CORRECTION

PATENT NO.   : 6,217,714 B1
DATED        : April 17, 2001
INVENTOR(S)  : Nishihara et al.

It is certified that error appears in the above-identified patent and that said Letters Patent is hereby corrected as shown below:

<u>Title page,</u>
Item [56], "FOREIGN PATENT DOCUMENTS" section, "61-61387" should read -- 63-61387 --.

Signed and Sealed this

Twenty-sixth Day of March, 2002

Attest:

*Attesting Officer*

JAMES E. ROGAN
*Director of the United States Patent and Trademark Office*